(12) United States Patent
Darnell et al.

(10) Patent No.: US 10,318,251 B1
(45) Date of Patent: Jun. 11, 2019

(54) CODE GENERATION AND SIMULATION FOR GRAPHICAL PROGRAMMING

(71) Applicant: Altair Engineering, Inc., Troy, MI (US)

(72) Inventors: Peter Darnell, Westford, MA (US); Richard A. Kolk, Louisville, KY (US)

(73) Assignee: Altair Engineering, Inc., Troy, MI (US)

( * ) Notice: Subject to any disclaimer, the term of this patent is extended or adjusted under 35 U.S.C. 154(b) by 119 days.

(21) Appl. No.: 15/400,485

(22) Filed: Jan. 6, 2017

Related U.S. Application Data (60) Provisional application No. 62/277,265, filed on Jan. 11, 2016.

(51) Int. Cl.
   *G06F 8/34* (2018.01)
   *G06F 8/36* (2018.01)

(52) U.S. Cl.
   CPC . *G06F 8/34* (2013.01); *G06F 8/36* (2013.01)

(58) Field of Classification Search
   CPC ...................................... G06F 8/36; G06F 8/24
   See application file for complete search history.

(56) References Cited

U.S. PATENT DOCUMENTS

| | | | | |
|---|---|---|---|---|
| 5,291,587 | A | * | 3/1994 | Kodosky ............... G06F 3/0481 703/2 |
| 5,987,246 | A | * | 11/1999 | Thomsen .................. G06F 8/34 345/501 |
| 2003/0107595 | A1 | * | 6/2003 | Ciolfi ........................ G06F 8/34 715/762 |
| 2005/0138045 | A1 | * | 6/2005 | Zarrinkoub ............... G06F 8/34 |
| 2014/0168130 | A1 | * | 6/2014 | Hirai ....................... G10L 15/00 345/173 |

* cited by examiner

*Primary Examiner* — Viva Miller
(74) *Attorney, Agent, or Firm* — Fish & Richardson P.C.

(57) ABSTRACT

A graphical block diagram can be used to execute multiple operating modes, such as a code generation or simulation mode. The graphical block diagram may include at least a first graphical block used solely in a first operating mode and a second graphical block used solely in a second operating mode. Each of the first and second graphical blocks includes a respective input receiving an input from a defined mode block. The defined mode block produces a mode output indicating a selection of one of the multiple operating modes. Other blocks of the graphical block diagram may be used in more than one operating mode. Depending on the value of the mode output, the graphical block diagram is interpreted according to the first or second operating mode. More than two operating modes are possible. The techniques described herein improve a model-based development platform.

20 Claims, 3 Drawing Sheets

CODE GENERATION AND SIMULATION FOR GRAPHICAL PROGRAMMING

CROSS-REFERENCE TO RELATED APPLICATION

This application claims priority to U.S. Provisional Patent Application No. 62/277,265, filed on Jan. 11, 2016, the contents of which are incorporated herein in their entirety by reference.

TECHNICAL FIELD

This disclosure is directed generally to graphical programming in a model-based platform, and more particularly to a platform capable of implementing multiple modes from a common graphical block diagram.

BACKGROUND

Graphical programming is a method of programming using interconnected graphical blocks. In graphical data flow diagrams, execution order is dictated by the directional connectivity of the blocks. This is in contrast to text-based languages like C and FORTRAN, which are generally ordered left to right and top down, but are subject to the dictates of such programming constructs as function calls and "goto" statements. Graphical programming can also be used to generate state diagrams. State diagrams and graphical data flow diagrams may be referred to as math models, so a graphical program may be referred to as a model-based platform.

SUMMARY

According to one method described herein for using a graphical block diagram for multiple operating modes, the method comprises receiving the graphical block diagram. The graphical block diagram comprises graphical blocks including at least a first graphical block used solely in a first operating mode of the multiple operating modes and a second graphical block used solely in a second operating mode of the multiple operating modes. Each of the first graphical block and the second graphical block include a respective input receiving an input from a defined mode block of the graphical blocks. The defined mode block is configured to produce a mode output indicating a selection of one of the multiple operating modes. The mode output is determined. The method also includes, upon a condition that the mode output provided to the first graphical block and the second graphical block indicates selection of the first operating mode, interpreting the graphical block diagram according to the first operating mode using the first graphical block and not the second graphical block, and upon a condition that the mode output provided to the first graphical block and the second graphical block indicates selection of the second operating mode, interpreting the graphical block diagram according to the second operating mode using the second graphical block and not the first graphical block.

In some implementations, the defined mode block represents a built-in variable. All blocks may be executed on the same PC as the block diagram program, but they may be executed in a processor-based system. In a desirable implementation, one mode is a code generation mode that implements the block diagram in a standard batch code like C. In any event, the diagram may be compiled to run on an embedded or non-embedded computer.

An apparatus for producing a graphical block diagram for use in multiple operating modes is also described herein. The apparatus comprises graphical blocks stored within a non-transitory storage medium, the graphical blocks comprising at least a first graphical block used solely in a first operating mode of the multiple operating modes and a second graphical block used solely in a second operating mode of the multiple operating modes. The apparatus also includes an graphics processor configured to, responsive to user input, generate the graphical block diagram for display on an output screen, the graphical block diagram comprising at least some of the graphical blocks including the first graphical block and the second graphical block, and each of the first graphical block and the second graphical block including a respective input receiving an input from a defined mode block of the graphical blocks. The defined mode block is configured to produce a mode output indicating a selection of one of the multiple operating modes. Upon a condition that the mode output provided to the first graphical block and the second graphical block indicates selection of the first operating mode, the graphical block diagram is interpreted according to the first operating mode using the first graphical block and not the second graphical block. Upon a condition that the mode output provided to the first graphical block and the second graphical block indicates selection of the second operating mode, the graphical block diagram is interpreted according to the second operating mode using the second graphical block and not the first graphical block.

Another method for using a graphical block diagram for multiple operating modes, comprises receiving the graphical block diagram, the graphical block diagram comprising graphical blocks including at least a first graphical block used in each of a first operating mode and a second operating mode of the multiple operating modes, the first graphical block responsive to a variable indicating a selection of one of the multiple operating modes. The method also includes determining the variable. Upon a condition that the variable indicates selection of the first operating mode, the graphical block diagram is interpreted according to the first operating mode using the first graphical block producing a first output. Upon a condition that the variable indicates selection of the second operating mode, the graphical block diagram is interpreted according to the second operating mode using the first graphical block producing a second output different from the first output.

These and other aspects of the present disclosure are disclosed in the following detailed description of the embodiments, the appended claims and the accompanying figures.

BRIEF DESCRIPTION OF THE DRAWINGS

The description herein makes reference to the accompanying drawings described below wherein like reference numerals refer to like parts throughout the several views.

DETAILED DESCRIPTION

Graphical block diagrams are popular because the user does not have to learn a text-based syntax. One graphical programming environment is the VisSim™ system development software, which allows the easy creation of math models and is hence often referred to as a model-based platform. A graphical data flow block diagram (GDFBD) developed within the software consists of a plurality of interconnected blocks where at least a subset of the connections among the blocks indicates that data produced by a block is used by another block. A graphical state block diagram (or graphical state diagram) may also be implemented by the software, where the graphical blocks represent nodes in the state diagram.

Graphical block diagrams may be designed for different operating modes. In a code generation mode, functions associated with blocks within a graphical block diagram are used to generate code to run on a processor in a processor-controlled system in accordance with the layout (also called the arrangement) of the blocks. When targeting a specific microprocessor chip for code generation, for example, the diagram usually contains blocks representing specific hardware features of the chip like Controller Area Network (CAN) bus ports, a serial port, an analog-to-digital converter (ADC) or pulse-width modulation (PWM) port, etc. Using these blocks, data may be read and written to the target (e.g., an embedded chip). While these blocks are useful for code generation, particularly embedded code generation, different blocks are most often required for other modes. In a simulation mode, for example, blocks are included to simulate inputs and responses from a processor-controlled system according to the arrangement of blocks within the graphical block diagram. In other words, blocks may be specific to mode, so two or more diagrams are often created for the same processor-controlled system, such as one with simulated input/response data and one with actual hardware input/output (I/O). However, maintaining multiple diagrams can be tedious and error-prone, especially when a relatively high number of the same blocks are used in each of the multiple diagrams.

In contrast, the teachings herein describe a system, apparatus, and method for producing a graphical block diagram for use with multiple operating modes. The teachings herein also describe a system, apparatus, and method for using a graphical block diagram for multiple operating modes. The modes may include, for example, simulation and code generation modes. This can be achieved using a special block that can be tested by blocks within the diagram for a mode output that indicates what operating mode is being executed by a user. By using blocks such as conditional value selection or conditional execution subsystems combined with this special block, a block diagram can be formed that contains blocks specific to different modes (e.g., both microprocessor-specific blocks as well as plant simulation blocks) and contains blocks that are common to different modes. Other details are described herein after first describing an environment in which the disclosure may be implemented.

Figure 1:
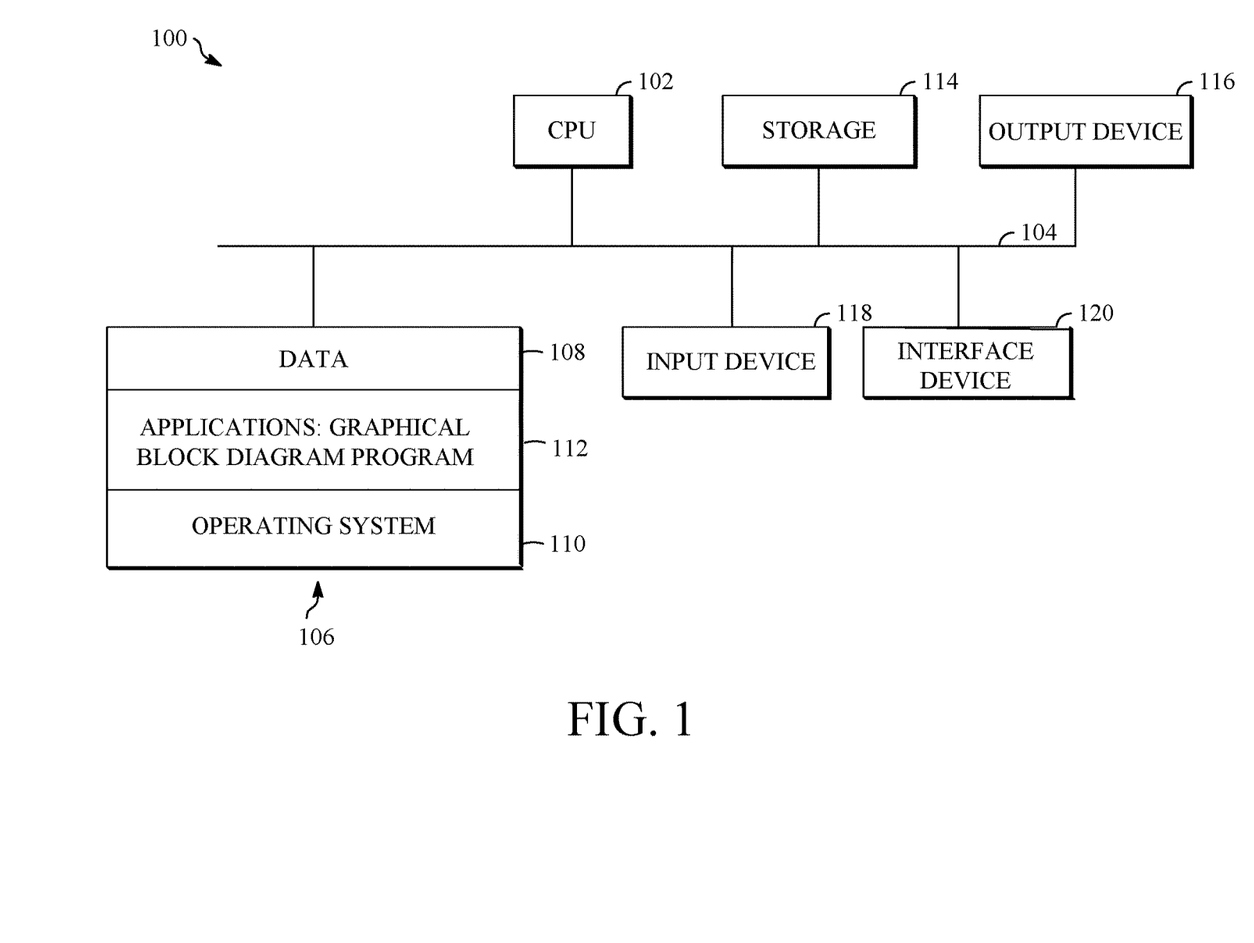
FIG. 1 is a block diagram of an example of a computing device that can implement the teachings herein.

FIG. 1 is a block diagram of an example of a computing device 100 that can implement the teachings herein. The computing device 100 can be in the form of a computing system including multiple computing devices, or in the form of a single computing device, for example, a server computer, a mobile phone, a tablet computer, a laptop computer, a notebook computer, a desktop computer, and the like.

A processor in the computing device 100 can be a central processing unit (CPU) 102. Alternatively, the processor can be any other type of device, or multiple devices, capable of manipulating or processing information now-existing or hereafter developed. Although a single processor as shown, e.g., CPU 102, more than one processor may be used to improve speed and efficiency. The CPU 102 communicates with other components of the computing device 100, and optionally with external devices (e.g., other computing devices) through a bus 104.

A memory 106 in the computing device 100 can be a read only memory (ROM) device or a random access memory (RAM) device. Any other suitable type of non-transitory storage device can be used as the memory 106. The memory 106 can store data 108 that is accessed by the CPU 102 using the bus 104, such as data used in the implementations herein. The memory 106 can further include an operating system 110 and one or more application programs, including at least one graphical block program 112 that permits the CPU 102 to perform the methods described here. The computing device 100 can also include supplemental storage 114, which is, in some examples, a removable memory card of any type. The supplemental storage 114 can include any non-transitory storage medium. Data used in implementations herein may can be stored in whole or in part in the supplemental storage 114 and loaded into the memory 106 as needed for processing.

The computing device 100 can also include one or more output devices 116, such as a display. Each output device 116 can be coupled to the CPU 102 via the bus 104. When the output device 116 is or includes a display, the display can be implemented in various ways, including by a liquid crystal display (LCD), a cathode-ray tube (CRT) display, or a light emitting diode (LED) display, such as an organic LED (OLED) display. The display may be, in one example, a touch sensitive display that combines a display with a touch sensitive element that senses touch inputs. Other output devices that permit a user to program or otherwise use the computing device 100 can be provided in addition to a display.

The computing device 100 can also include or be in communication with one or more input devices 118. The input device 118 may be an image sensing device such as a camera, an audio sensing device such as a microphone, or a contact input device such as a keyboard and/or a mouse. When the input device 118 is an image sensing device, it may receive input from facial or hand gestures from a user instead of conventional keyboard or mouse inputs for use in controlling the computing device 100. Similarly, the input device 118 may receive input from verbal commands to control the computing device 100 when the input device 118 is or includes an audio sensing device.

In the computing device 100 of FIG. 1, an interface device 120 is coupled to the bus 104. In some implementations, the CPU 102 is capable of directly communicating with external devices, such as other computing devices, through the bus 104. In others, a communication protocol between the computing device 100 and one or more external devices is different such that the interface device 120 is desirable for the CPU 102 and other components of the computing device 100 to receive information from and transmit information to one or more external devices.

The computing device 100 can be implemented in a wide variety of configurations. For example, and although FIG. 1 depicts the CPU 102 and the memory 106 of the computing device 100 as being integrated into a single unit, other configurations are possible. The operations of the CPU 102 can be distributed across one or more of processors in multiple different machines that can be coupled directly or across a local area or other network through the interface device 120. The memory 106 can be distributed across multiple machines, such as in network-based memory. Although depicted here as a single bus, the bus 104 of the computing device 100 can be composed of multiple buses. Further, the supplemental storage 114 can be directly coupled to the other components of the computing device 100 or can be accessed via a network and can comprise a single integrated unit such as a memory card or multiple units such as multiple memory cards.

Components may be omitted from, or additional components included in, the computing device 100. For example, the computing device 100 may form part of an embedded system that includes integrated microcontrollers or processors implementing specific functions and, optionally, mechanical devices operating using those specific functions.

Figure 2:
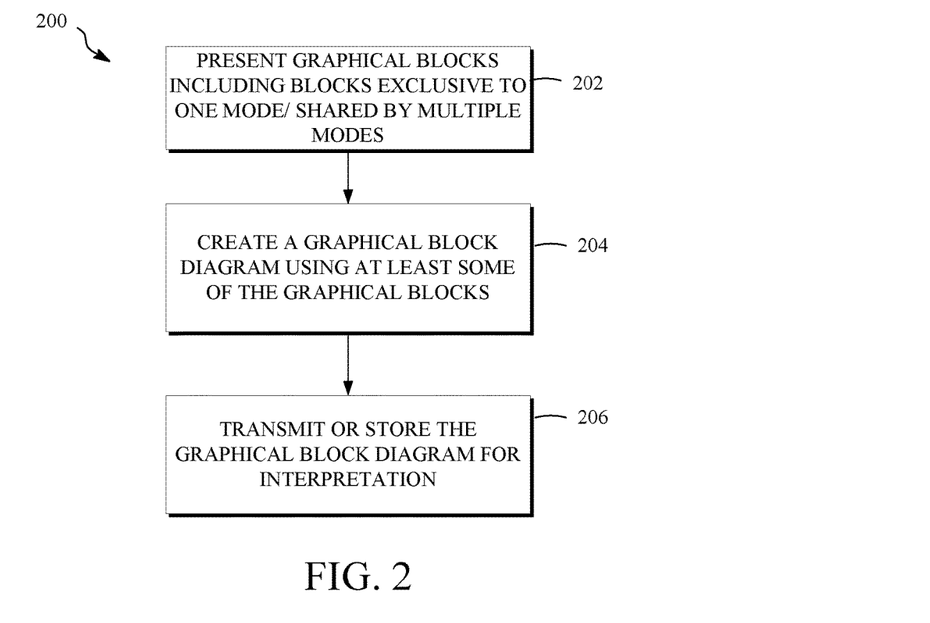
FIG. 2 is a flow chart diagram of a method for producing a graphical block diagram including multiple operating modes.

FIG. 2 is a flow chart diagram of a method 200 for producing a graphical block diagram for use in multiple operating modes. FIG. 2 can be implemented within a host computer or other processor-based device now or hereafter known in the computing arts, such as that shown in FIG. 1. For example, and with reference to FIG. 1, the operations of the method 200 may be performed by the CPU 102 based on an application program 112 stored in the memory 106. FIG. 2 is shown as a series of steps for convenience only—the various operations may be performed in various orders, while some may be skipped and others added and still being within the scope of the disclosure.

The method 200 as shown in FIG. 2 includes presenting graphical blocks including blocks exclusive to one operating mode and/or blocks shared by multiple operating modes at 202, creating a graphical block diagram using at least some of the graphical blocks at 204, and transmitting or storing the graphical block diagram for interpretation at 206.

The graphical blocks may be stored within a non-transitory storage medium, such as the memory 106 and/or the supplemental storage 114, and may be presented for selection to generate the graphical block diagram. For example, the graphical blocks may be presented by accessing them, in whole or in part, from the storage medium and transmitting them to an output device (e.g., output device 116), such as a display. The graphical blocks may alternatively be transmitted to the computing device of a user, such as through the interface device 120, for display by the computing device of the user.

The graphical blocks presented at 202 can include blocks exclusive to one operating mode where multiple operating modes are available. The multiple operating modes include, in some implementations, a code generation mode and a simulation mode. The multiple operating modes may additionally or alternatively include a validation mode. The code generation mode, simulation mode, and validation mode are discussed in additional detail below. In one example where the graphical blocks are exclusive to one operating mode, the graphical blocks include at least a first graphical block used solely in a first operating mode of the multiple operating modes and a second graphical block used solely in a second operating mode of the multiple operating modes.

The graphical blocks can additionally or alternatively include graphical blocks that can be used in more than one of the multiple operating modes (i.e., blocks shared by multiple operating modes). These graphical blocks can include variable blocks, decision blocks, etc. These graphical blocks can include blocks that receive different input values and/or output different output values depending upon the operating mode. For example, and in order for multiple operating modes to use a common graphical block diagram, the graphical blocks include a defined mode block that is configured to produce a mode output indicating the selection of one of the multiple operating modes.

Creating a graphical block diagram at 204 can include creating the graphical block diagram for display on an output screen. The graphical block diagram can be generated by receiving input from a user through an input device, such as the input device 118. The input includes, for example, the selection and arrangement of at least some of the graphical blocks to form a mathematical model. The graphical block diagram is created at 204 by a server remote from the user using its graphics processor, or is created at 204 by the graphics processor of a user's local computer. The graphics processor can be, for example, integral with the output device 116, e.g., when the output device 116 is an output screen, display, or graphical user interface, and the graphics processor interfaces with the CPU 102 to generate the graphical block diagram.

In one implementation, the graphical block diagram includes the first graphical block and the second graphical block. The first graphical block and the second graphical block each include a respective input receiving an input from the defined mode block referenced above. The first and second graphical blocks can receive their input from the same defined mode block in some implementations. Alternatively, the first and second graphical blocks can receive their input either directly or indirectly from different definable mode blocks within the graphical block diagram.

The method 200 of FIG. 2 transmits or stores the graphical block diagram, or both, for interpretation at 206. This may also be done as part of the operation at 204. When the graphical block diagram is created remotely from the user at 204, for example, creating the graphical block diagram may also include transmitting selected graphical blocks and/or code or states associated with selected graphical blocks to a location indicated by a user. The graphical block diagram can be stored at 206, either remotely or locally at the user's computing device. When stored remotely, the graphical block diagram can be transmitted to the user's computing device (e.g., through the interface device 120) at 206. Before transmitting or storing the graphical block diagram at 206, the graphical block diagram may be converted into another format.

The mode output of the defined mode block can be used in the interpretation of the graphical block diagram created using the defined mode block. For example, upon a condition that the mode output provided to the first graphical block and the second graphical block indicates selection of the first operating mode (i.e., the selected mode is the first operating mode), the graphical block diagram is interpreted according to the first operating mode using the first graphical block and not the second graphical block. Similarly, upon a condition that the mode output provided to the first graphical block and the second graphical block indicates selection of the second operating mode (i.e., the selected mode is the second operating mode), the graphical block diagram is interpreted according to the second operating mode using the second graphical block and not the first graphical block. Blocks of the graphical block diagram and interpretation of the graphical block diagram by a processor are discussed in more detail with regard to FIGS. 3 and 4.

Figure 3:
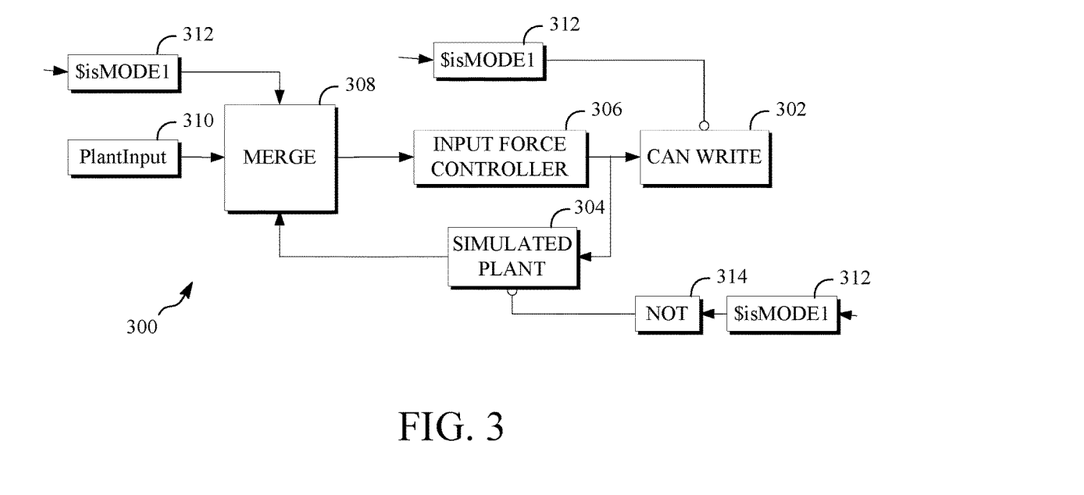
FIG. 3 is portion of a graphical block diagram produced according to the teachings herein.

FIG. 3 is portion of a graphical block diagram 300 produced according to the teachings herein. The graphical block diagram 300 of FIG. 3 is a data flow diagram produced according to the method 200 of FIG. 2. In this example, the continuous control of a plant is shown. The simulation, application (e.g., the code generation), and verification of any other data flow process, particularly a continuous control process, is also possible.

In FIG. 3, at least some of the graphical blocks used in the graphical block diagram 300 define respective functions while others define variables. By define, the present disclosure means to store, associate, assign, implement or otherwise represent one or more functions by a graphical block. A graphical block 302 labeled "CAN WRITE" represents one function or a group of functions that writes code and/or values code for transmission over a CAN bus port to an input of the system or device under control. A graphical block 304 labeled "SIMULATED PLANT" represents one function or a group of functions that simulates a plant response to an input force. Values for the input force are provided from a graphical block 306 labeled "INPUT FORCE CONTROLLER." The functions of the INPUT FORCE CONTROLLER graphical block 306 implement an input force controller for a plant, such as a generator, motor or other processor-controlled plant as the device under control. The input force values provided from the INPUT FORCE CONTROLLER graphical block 306 can also be supplied to the CAN WRITE graphical block 302 for writing to a system input.

The INPUT FORCE CONTROLLER graphical block 306 receives input from one of two sources from a graphical block 308 labeled "MERGE." Namely, the MERGE graphical block 308 receives simulated plant output from the SIMULATED PLANT graphical block 304 at a first input and receives input from a system output (e.g., from a plant as discussed in more detail below) at a graphical block 310 labeled "PlantInput." The MERGE graphical block 308 represents a multiplexer operation on the two inputs using a control input. In this example, the control input is the graphical block 312, which represents the variable $isMODE1. The variable $isMODE1 indicates the mode for the graphical block diagram and corresponds to the defined mode block described above. In this example, the variable $isMODE1 is a binary variable that has a first value or mode output (e.g., 1) when a first operating mode is enabled and a second value or mode output (e.g., 0) when a second operating mode is enabled. This is not necessary—there may be more than two operating modes, so the defined mode block may be other than a binary variable. Further, the MERGE graphical block 308 is not limited to two inputs. The MERGE graphical block 308 is an example of a graphical block shared by multiple modes. Its output changes based on the mode (i.e., based on the output value of the defined mode block 312.

The defined mode block, here the graphical block 312, may be established as a system variable. To be established as a system variable means that its mode output is set or reset to the same value every time it is used within the graphical block diagram 300. A user can select an operating mode from a screen (e.g., an output device 116) displaying the graphical block diagram, either through manipulation of a mouse, keyboard, or other input device 118 such as the screen itself when the screen is a touchscreen. Then, when the graphical block diagram is executed, the value associated with the selected operating mode is provided as the mode output (e.g., as an input value to other graphical blocks) at each location within the graphical block diagram that the defined mode block is invoked or used. The defined mode block may be thought of as a predefined block as it reflects the interpretation mode of the block diagram parser and is built into the system to properly reflect the current system mode.

As described above, the graphical blocks can define or represent functions or variables. One class of functions not previously mentioned that the graphical blocks can define is arithmetic or Boolean operators. In the example of FIG. 3, a graphical block 314 labeled "NOT" represents a Boolean not operation on an input value. In this way, the NOT graphical block 314 is, like the MERGE graphical block 308, a graphical block that is shared by multiple modes. The NOT graphical block 314 has both a different input value and a different output value depending upon the output of the defined mode block (that is, depending on the mode).

Figure 4:
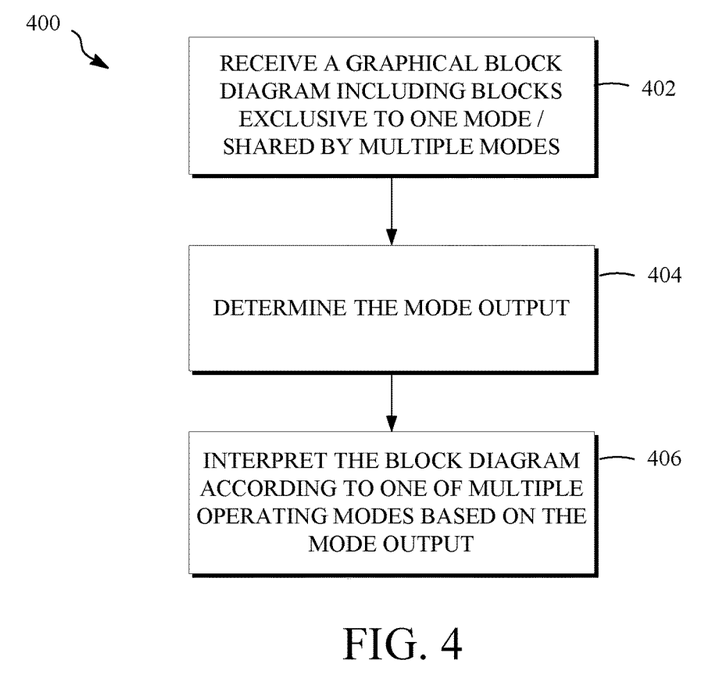
FIG. 4 is a flow chart diagram of a method for interpreting a graphical block diagram for multiple operating modes.

FIG. 4 is a flow chart diagram of a method 400 for interpreting a graphical block diagram for multiple operating modes. FIG. 4 can be implemented within a host computer or other processor-based device now or hereafter known in the computing arts, such as that shown in FIG. 1. For example, and with reference to FIG. 1, the operations of the method 400 may be performed by the CPU 102 based on an application program 112 stored in the memory 106. FIG. 4 is shown as a series of steps for convenience only—the various operations may be performed in various orders, while some may be skipped and others added and still being within the scope of the disclosure.

The method 400 as shown in FIG. 4 includes receiving a graphical block diagram including blocks exclusive to one operating mode and/or blocks shared by multiple operating modes at 402, determining the mode output at 404, and interpreting the block diagram according to one of multiple operating modes based on the mode output at 206.

Receiving the graphical block diagram at 402 can include receiving the graphical block diagram at the computing device of a user from a non-transitory storage medium, such as the memory 106 and/or the supplemental storage 114, in which the graphical block diagram is stored. The graphical blocks may alternatively be received from external of the computing device, such by transmission through the interface device 120 from a source that created the graphical block diagram. The graphical block diagram may, in some cases, be displayed by the computing device, such as on an output device 116 of FIG. 1, for further manipulation by the user using a graphics processor of the output device 116. The graphical block diagram does not have to be received in any particular format. The graphical block diagram may have been initially created using a graphics processor, responsive to user input, arranging graphical blocks on a display or output screen.

As mentioned, the graphical block diagram can include blocks exclusive to one operating mode. This can include blocks exclusive to each of the available operating modes, such as first blocks exclusive to a first operating mode, second blocks exclusive to a second operating mode, etc. The graphical block diagram can additionally or alternatively include blocks that are in common between two or more operating modes (that is, graphical blocks that are shared by multiple operating modes). In one implementation, the graphical block diagram comprises graphical blocks including at least a first graphical block used solely in a first operating mode of the multiple operating modes and a second graphical block used solely in a second operating mode of the multiple operating modes, where each of the first graphical block and the second graphical block includes a respective input receiving an input from a defined mode block of the graphical blocks. The defined mode block is configured to produce a mode output indicating a selection of one of the multiple operating modes. In this or other implementations, the graphical block diagram comprises graphical blocks including at least one graphical block used in both a first operating mode of the multiple operating modes and a second operating mode of the multiple operating modes. Each "shared" graphical block is responsive to a mode output of a defined mode block that indicates a selection of one of the multiple operating modes to produce a different output when the graphical block diagram is interpreted for the first operating mode as compared to when the graphical block diagram is interpreted for the second operating mode.

Using the graphical block diagram 300 as an example, the CAN WRITE graphical block 302 is used solely in a first operating mode, here a code generation mode that interprets the graphical block diagram by generating code for execution within a processor-controlled system based on a layout of the at least some of the graphical blocks within the graphical block diagram. The graphical block 304 (i.e., SIMULATED PLANT) is used solely in a second operating mode, here a simulation mode that interprets the graphical block diagram by simulating a response of a processor-controlled system to a layout of the at least some of the graphical blocks within the graphical block diagram. The graphical block 312 (i.e., $isMODE1) is the defined mode block in this example, and the graphical block 312 produces a mode output indicating the selection of one of the multiple (here, two) operating modes as discussed in more detail below. A block used solely in one operating mode may receive input in more than one operating mode, even if it is only the input from the defined mode block. By used solely in one operating mode, this disclosure means that output of such a block is used in the one operating mode, but not in any other operating modes. Alternatively or additionally, it means that the block produces an output only in the one operating mode, and not in others (e.g., it is omitted when the graphical block diagram is interpreted). In this way, it may also be concluded that the PlantInput graphical block 310 is used solely in the first, code generation mode.

As can be seen by reference to FIG. 3, some blocks of a graphical block diagram may be used in more than one operating mode. In addition to the defined mode block itself (i.e., the graphical block 312), for example, the graphical blocks 306, 308, and 314 are used in both a first operating mode and a second operating mode (i.e., the code generation mode and the simulation mode) of FIG. 3. As described above, the input, output, or both of these graphical blocks may be different in these operating modes.

The graphical block 312 is included three times in this example, and each occurrence is coupled to an input of a different graphical block. Namely, the CAN WRITE graphical block 302 is a first graphical block that includes an input that receives an input directly from a graphical block 312, the SIMULATED PLANT graphical block 304 is a second graphical block that includes an input that receives an input indirectly from another graphical block 312 through the NOT graphical block 314, which represents a Boolean not operator, and the MERGE graphical block 308 is a third graphical block that includes an input that receives an input directly from a final graphical block 312. Using multiple defined mode blocks for input to a respective graphical block is desirable because of its ease of editing—each defined mode block can be added, removed, or moved within the graphical block diagram 300 with the graphical block to which it is coupled. However, this is not necessary as in some implementations one defined mode block can provide an input to multiple graphical blocks. Further, in some implementations, the graphical blocks may be selected and arranged such that one or more defined mode blocks may be omitted. In FIG. 3, for example, the PlantInput graphical block 310 may be coupled to a true input, while the SIMULATED PLANT graphical block 304 is coupled to a false input. In this case, the NOT graphical block 314 and its input defined mode block 312 may be omitted. When $isMODE1 is true (i.e., the output of the defined mode block 312 is true, e.g., 1), the SIMULATED PLANT graphical block 304 performs its function, but its output is not used by the MERGE graphical block 308. Contrastingly, When $isMODE1 is false (i.e., the output of the defined mode block 312 is false, e.g., 0), the SIMULATED PLANT graphical block 304 performs its function, and its output is used by the MERGE graphical block 308.

Referring again to FIG. 4, after the graphical block diagram is received and optionally displayed at 402, the mode output is determined at 404. Determining the mode output can include receiving a user input that determines the mode output of the defined mode block. For example, the user input can be the toggling of a mode selector switch using an input device, such as the input device 118 (e.g., a touch-sensitive screen, keyboard, or mouse). The mode selector switch can be displayed on an output device, such as the output device 116, and can be, in some embodiments, a graphical block. Alternatively, determining the mode output at 404 can include querying a variable stored in association with the graphical block diagram that is or indicates the mode output. In some embodiments, a variable that is or indicates the mode output may or may not be stored in association with the graphical block diagram, but can in any event be changed by a user before interpretation of the graphical block diagram. For example, the defined mode block, the graphical block 312, can produce a mode output indicating the selection of the operating mode responsive to a user selection (i.e., user input) initiating interpretation. The mode output is a binary variable in the example of FIG. 3 because there are two modes.

Once the mode output is determined at 404, the graphical block diagram is interpreted according to one of the multiple operating modes based on the mode output at 406. Interpreting the graphical block diagram may be performed by a graphical block diagram parser of the graphical block diagram program. A graphical block diagram parser interprets a graphical block diagram according to the arrangement of the graphical blocks, and the interconnections between them, according to defined rules. For example, consumer blocks (those with inputs and no outputs) may be considered before other blocks. Blocks at the top of a page (as viewed) may be considered before blocks further down the page. In any event, the graphical block diagram parser decides the sequence of executing the graphical blocks. The variable (e.g., the mode output) indicates the interpretation mode of the block diagram parser. Upon a condition that the mode output provided to the first graphical block and the second graphical block indicates selection of the first operating mode, the graphical block diagram is interpreted according to the first operating mode using the first graphical block and not the second graphical block. With reference to the example of FIG. 3, the graphical block 312 produces the value 1 (true) when generating code and 0 (false) when simulating.

In this example, interpreting the graphical block diagram according to the first operating mode includes generating (e.g., including compiling) code to implement the graphical block diagram. Stated differently, interpreting the graphical block diagram for the code generation mode can include generating code for execution within a processor-controlled system based on a layout of the graphical blocks within the graphical block diagram.

The graphical block diagram 300 interpreted for the code generation mode receives the value "1" at the MERGE graphical block 308 from a graphical block (defined mode block $isMODE1) 312. This selects the "true" input of the MERGE graphical block 308, which here is the PlantInput graphical block 310. The PlantInput graphical block 310 is a hardware I/O block and is one example of a hardware device register on the target (i.e., the plant to be controlled according to the generated code) and may also be referred to as a target hardware-specific block. The output of the MERGE graphical block 308 is provided as an input to the INPUT FORCE CONTROLLER graphical block 306. The CAN WRITE graphical block 302 (i.e., a first graphical block) receives the value "1" from a defined mode block ($isMODE1) and enables it to act on output from the INPUT FORCE CONTROLLER graphical block 306. The NOT graphical block 314, which is a Boolean operator, receives the value "1" from a defined mode block ($isMODE1) and performs a Boolean not operation on this input value. Accordingly, the output of the NOT graphical block 314 provided to the SIMULATED PLANT graphical block 304 has a value "0." This input disables the SIMULATED PLANT graphical block 304, which is a second graphical block in this example, so that the SIMULATED PLANT graphical block 304 is not used in the code generation mode.

The code generated by interpretation of the graphical block diagram 300 may be in a standard batch code, for example. The generated code from the graphical block diagram 300 in the code generation mode is as follows:

```
/* CAN write */
static void subsystem8( )
{
canTrans6.in1=hSubsystem8->inSigS[0]->u.Double;
ecan_write_mbox(0, &canTrans6);
}
/* Simulated Plant */
static void cgMain( )
{
int t3;
static CGDOUBLE_Y_13;
t3=PlantInput;
_xf_Xdot_13=((t3*0.000244140625))
   *0.64454612646732-_xf_state13[0]
   *0.59811945970049-_xf_state13[1]
   *0.14918562788025;
_Y_13=_xf_Xdot_13+_xf_state13[1]
   *0.27126818740759+_xf_state13[0]
   *1.4396395596575;
/* CAN write */
hSubsystem8->inSigS[0]->u.Double=_Y_13;
subsystem8( )
_xf_state13[1]=_xf_state13[0];
_xf_state13[0]=_xf_Xdot_13;
}
```

As can be seen, the standard batch code in this example is C, but any batch code known or unknown is possible. The resulting code may be used in an embedded processor for control of the target plant, or may be used in any other processor-controlled system.

In contrast, and upon a condition that the mode output provided to the first graphical block and the second graphical block indicates selection of the second operating mode, the graphical block diagram is interpreted according to the second operating mode using the second graphical block and not the first graphical block. Again referring to the example of FIG. 3, the graphical block 312 produces the value "0" when the second operating mode, here a simulation mode, is selected. In the simulation mode, the graphical block diagram is interpreted by simulating a response of a processor-controlled system (e.g., a target plant) to a layout of the graphical block diagram 300 (e.g., by executing the graphical block diagram 300).

The graphical block diagram 300 interpreted for the simulation mode receives the value "0" at the MERGE graphical block 308 from a graphical block (defined mode block $isMODE1) 312. This selects the "false" input of the MERGE graphical block 308, which here is the SIMULATED PLANT graphical block 304. This means that the PlantInput graphical block 310 is not used in the simulation mode. The NOT graphical block 314, which is a Boolean operator, also receives the value "0" from a defined mode block 312 and performs a Boolean not operation on this input value. Accordingly, the output of the NOT graphical block 314 provided to the SIMULATED PLANT graphical block 304 has a value "1." This input enables the SIMULATED PLANT graphical block 304, which is a second graphical block in this example, so that the SIMULATED PLANT graphical block 304 is used in the simulation mode. The output of the MERGE graphical block 308 is provided as an input to the INPUT FORCE CONTROLLER graphical block 306. In this way, the INPUT FORCE CONTROLLER graphical block 306, like the MERGE graphical block 308 and the NOT graphical block 314, is used in each of the two available modes. The CAN WRITE graphical block 302 (i.e., a first graphical block) receives the value "0" from a defined mode block ($isMODE1) and disables it. In this way, the CAN WRITE graphical block 302 is not used in the simulation mode. The resulting loop of the MERGE graphical block 308, the INPUT FORCE CONTROLLER graphical block 306, and the SIMULATED PLANT graphical block 304 simulates the target plant response to input forces.

Two operating modes are shown in FIG. 3, namely a simulation mode and a code generation mode. This is shown by example, and different or additional modes are possible. As mentioned briefly above, a validation mode is possible. A validation mode may be used for calibration of the model. Calibration can be an iterative process that compares the model to actual system behavior and uses the discrepancies to improve the model until an acceptable level of model accuracy is received. In an implementation including a validation mode, for example, the graphical blocks can include graphical blocks that perform comparisons, graphical blocks that enable different paths within the graphical block diagram, etc., for use in validation in addition to the blocks implementing the model itself.

Figure 5:
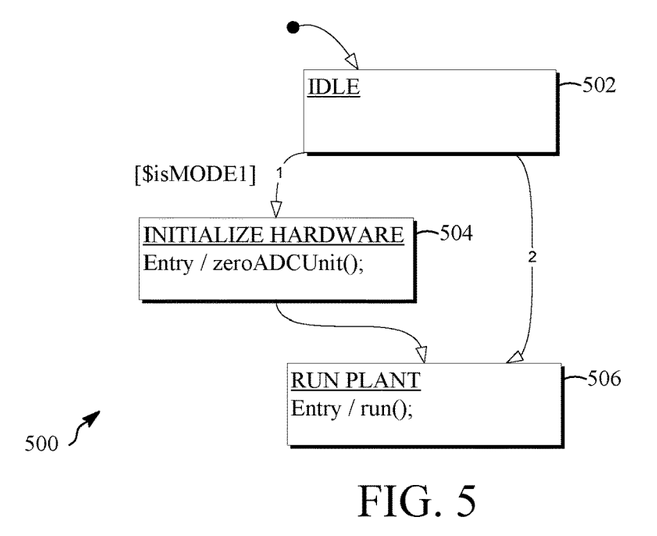
FIG. 5 is portion of another graphical block diagram produced according to the teachings herein.

FIG. 5 is a portion of another graphical block diagram 500 produced according to the teachings herein. The graphical block diagram of FIG. 5 is a state machine represented by a state transition diagram and hence comprises at least some blocks defining respective states or nodes. The state machine may be any type of state machine including a finite state machine, a UML state machine, or any other type of state machine. In this example, the graphical blocks 502, 504, 506 each define a state or node within the state machine. At the initial state represented by the graphical block 502, a plant is idled. A change of state depends upon the value of the variable $isMODE1. For example, if the value indicates a code generation mode (i.e., the value of the variable $isMODE1 is true), the state changes from the initial state to the state represented by the graphical block 504 before changing to the state represented by the graphical block 506.

Otherwise, the state changes from the initial state directly to the state represented by the graphical block 506. The graphical block 504 represents an initialize hardware state. For example, a command zeroADCUnit( ) may be used when in the initialize hardware state occurs. The graphical block 506 represents the run plant state that uses a command run( ). The initialize hardware state (graphical block 504) is only used when the variable $isMODE1 is true (i.e., in a code generation mode), while the other states (graphical blocks 502, 506) are used in either operating mode. A simulation mode omits the initialize hardware state. The variable $isMODE1 may be considered a condition attached to a state transition to the state represented by the graphical block 504, or a condition attached to a state transition from the initial state represented by the graphical block 502 to either the initialize hardware state or the run state (e.g., a condition of the control flow). In this way, the output of the graphical block 502 (i.e., the state transition) is different responsive to the variable. Here, the processor-controlled system implemented through use of the graphical block diagram 500 and the particular states or operating mode are not further shown for simplicity. The graphical block diagram 500 may, however, represent any control flow. In one example, the control flow is nuclear control staging.

In summary, a variable included in a graphical block diagram allows the graphical block diagram to include graphical blocks that can be used in only one mode, for example, simulation blocks and target hardware I/O blocks, in addition to graphical blocks that can be used in more than one mode. By combining conditional selection and conditional execution blocks with the variable, a common graphical block diagram to be used to execute multiple modes. In theory, this can result in a performance penalty (e.g., executing in the code generation mode may be penalized by the inclusion of simulation-only blocks in the graphical block diagram). However, this is expected to be small and could be minimized or eliminated through efficient coding.

In the various embodiments and implementations, any of the features and techniques disclosed herein may be used with respect to any of the methods described herein.

While the invention has been described in connection with certain embodiments, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus comprising:
one or more processors; and
one or more non-transitory computer-readable media including one or more sequences of instructions which, when executed by the one or more processors, causes:
receiving, by the one or more processors, data representing a plurality of graphical blocks, at least some of the plurality of graphical blocks defining respective computer functions, the plurality of graphical blocks comprising at least a first graphical block used solely in a first operating mode of a plurality of operating modes of a graphical block diagram and a second graphical block used solely in a second operating mode of the plurality of operating modes of the graphical block diagram; and
responsive to user input, generating, using the one or more processors, the graphical block diagram for display on an output screen, the graphical block diagram comprising at least some of the plurality of graphical blocks including the first graphical block and the second graphical block, the graphical blocks of the graphical block diagram being interconnected, and each of the first graphical block and the second graphical block including a respective input receiving mode output from a defined mode block of the plurality of graphical blocks, wherein:
the defined mode block is configured to produce the mode output indicating a selection of one of the multiple operating modes;
upon a condition that the mode output provided to the first graphical block and the second graphical block indicates selection of the first operating mode, executing, by the one or more processors, the graphical block diagram according to the first operating mode using the first graphical block and not the second graphical block; and
upon a condition that the mode output provided to the first graphical block and the second graphical block indicates selection of the second operating mode, executing, by the one or more processors, the graphical block diagram according to the second operating mode using the second graphical block and not the first graphical block.

2. The apparatus of claim 1, wherein the first operating mode comprises a code generation mode that generates code for execution based on a layout of the at least some of the plurality of graphical blocks within the graphical block diagram.

3. The apparatus of claim 1, wherein the first operating mode comprises a simulation mode that simulates a response of a system based on a layout of the at least some of the plurality of graphical blocks within the graphical block diagram.

4. The apparatus of claim 1, wherein the defined mode block comprises a variable such that the mode output is a first value responsive to user selection of the first operating mode and is a second value responsive to user selection of the second operating mode.

5. The apparatus of claim 4, wherein: the variable is a binary variable;
the plurality of graphical blocks includes a third graphical block that represents a Boolean not operation on an input value; and
one of:
upon a condition that the mode output is the first value, executing the graphical block diagram according to the first operating mode using the first graphical block and not the second graphical block by receiving the first value directly from a defined mode block at the input of the first graphical block and receiving the second value as an output from a third graphical block whose input is the first value; or
upon a condition that the mode output is the second value, executing the graphical block diagram according to the second operating mode using the second graphical block and not the first graphical block by receiving the second value directly from a defined mode block at the input of the second graphical block and receiving the first value as an output from the third graphical block whose input is the first value.

6. The apparatus of claim 5, wherein the plurality of graphical blocks includes a fourth graphical block used in at least the first operating mode and the second operating mode of the multiple operating modes.

7. The apparatus of claim 6, wherein:
the fourth graphical block represents a multiplexer operation on two inputs using a control input; and
one of:
upon a condition that the mode output is the first value, executing the graphical block diagram according to the first operating mode using a fourth graphical block by receiving the first value at the control input of the fourth graphical block and generating an output using a first input of the two inputs; or
upon a condition that the mode output is the second value, executing the graphical block diagram according to the second operating mode using the fourth graphical block by receiving the second value at the control input of the fourth graphical block and generating the output using a second input of the two inputs.

8. The apparatus of claim 7, wherein:
the first input comprises a variable block representing an output of a system; and
the second input comprises an output of a simulation of the system.

9. The apparatus of claim 1, wherein the one or more processors is configured to compile the graphical block diagram to run on a computer.

10. A method comprising:
receiving, at a computing device, data representing a graphical block diagram, the graphical block diagram comprising a plurality of graphical blocks, at least some of the plurality of graphical blocks defining respective computer functions, the plurality of graphical blocks being interconnected, the plurality of graphical blocks including at least a first graphical block used in each of a first operating mode of the graphical block diagram and a second operating mode of a plurality of operating modes of the graphical block diagram, the first graphical block responsive to a variable indicating a selection of one of the multiple operating modes;
determining the variable;
upon a condition that the variable indicates selection of the first operating mode, executing the graphical block diagram according to the first operating mode using the first graphical block producing a first output; and
upon a condition that the variable indicates selection of the second operating mode, executing the graphical block diagram according to the second operating mode using the first graphical block producing a second output different from the first output.

11. The method of claim 10, wherein the graphical block diagram comprises a data flow diagram, and the first graphical block has an input receiving the variable from a defined mode block of the plurality of graphical blocks included in the graphical block diagram.

12. The method of claim 10, wherein the plurality of graphical blocks comprise at least some graphical blocks defining respective states, and the graphical block diagram comprises a state transition diagram.

13. The method of claim 12, wherein the variable is a condition for transitioning from the state defined by the first graphical block to a state represented by a second graphical block of the graphical block diagram.

14. The method of claim 10, wherein the graphical block diagram comprises at least a second graphical block used solely in the first operating mode of the plurality of operating modes and a third graphical block used solely in the second operating mode of the plurality of operating modes, each of the second graphical block and the third graphical block including a respective input receiving an input from a defined mode block of the graphical blocks, the defined mode block representing the variable;
upon the condition that the variable indicates selection of the first operating mode, executing the graphical block diagram according to the first operating mode using the first graphical block producing the first output, the second graphical block, and not the third graphical block; and
upon the condition that the variable indicates selection of the second operating mode, executing the graphical block diagram according to the second operating mode using the first graphical block producing the second output, the third graphical block, and not the second graphical block.

15. A method comprising:
receiving, at a computing device, data representing a graphical block diagram, the graphical block diagram comprising a plurality of graphical blocks, at least some of the plurality of graphical blocks defining respective computer functions, the plurality of graphical blocks being interconnected, the plurality of graphical blocks including at least a first graphical block used solely in a first operating mode of a plurality of operating modes of the graphical block diagram and a second graphical block used solely in a second operating mode of the plurality of operating modes of the graphical block diagram, each of the first graphical block and the second graphical block including a respective input receiving an input from a defined mode block of the graphical blocks, and the defined mode block configured to produce a mode output indicating a selection of one of the multiple operating modes;
determining the mode output;
upon a condition that the mode output provided to the first graphical block and the second graphical block indicates selection of the first operating mode, executing the graphical block diagram according to the first operating mode using the first graphical block and not the second graphical block; and
upon a condition that the mode output provided to the first graphical block and the second graphical block indicates selection of the second operating mode, executing the graphical block diagram according to the second operating mode using the second graphical block and not the first graphical block.

16. The method of claim 15, further comprising:
receiving, at the computing device, a user input that determines the mode output of the defined mode block.

17. The method of claim 15, wherein the executing the first operating mode comprises:
generating code to implement the graphical block diagram in a standard batch code.

18. The method of claim 17, wherein the standard batch code is C.

19. The method of claim 15, wherein the first graphical block comprises a target hardware-specific block, the first operating mode is a code generation mode, the second graphical block is a simulation block, and the second operating mode is a simulation mode.

20. The method of claim 15, wherein:
the plurality of graphical blocks include a third graphical block used in at least the first operating mode and the second operating mode of the plurality of operating modes; and
one of:

upon a condition that the mode output is a first value, executing the graphical block diagram according to the first operating mode by receiving a first value of the mode output at a control input of the third graphical block and generating an output from the third graphical block responsive to the first value; or upon a condition that the mode output is a second value, executing the graphical block diagram according to the second operating mode by receiving a second value of the mode output at the control input of the third graphical block and generating an output from the third graphical block responsive to the second value, the second value different from the first value.

\* \* \* \* \*